United States Patent [19]

Khan et al.

[11] Patent Number: 4,837,384
[45] Date of Patent: Jun. 6, 1989

[54] NICKEL-BASED MONOCRYSTALLINE SUPERALLOY, IN PARTICULAR FOR THE BLADES OF A TURBOMACHINE

[75] Inventors: Tasadduq Khan, Jouy en Josas; Pierre Caron; Jean-Louis Raffestin, both of Les Ulis, all of France

[73] Assignee: Office National d'Etudes et de Recherche Aerospatiales, Chatillon Cedex, France

[21] Appl. No.: 55,465

[22] Filed: May 28, 1987

[30] Foreign Application Priority Data

Jun. 4, 1986 [FR] France ................................ 86 08068

[51] Int. Cl.⁴ .............................................. C22F 1/10
[52] U.S. Cl. ........................................ 148/3; 148/162; 148/404; 148/410
[58] Field of Search ..................... 420/448; 148/404, 3, 148/162, 410, 428

[56] References Cited

FOREIGN PATENT DOCUMENTS

| 0187444 | 7/1986 | European Pat. Off. . |
| 2037020 | 1/1972 | Fed. Rep. of Germany . |
| 2555204 | 3/1985 | France . |
| 2071695 | 9/1981 | United Kingdom . |

*Primary Examiner*—R. Dean
*Attorney, Agent, or Firm*—Herbert Dubno; Jonathan Myers

[57] ABSTRACT

A low density superalloy having good resistance to oxidation has the following composition by weight:

Co: 5.0 to 6.0%
W: 4.8 to 5.2%
Cr: 7.8 to 8.3%
Al: 5.8 to 6.1%
Ta: 3.3 to 3.7%
Mo: 2.1 to 2.4%
Ti: 1.8 to 2.2%
B: $\leq$ 10 ppm
Zr: $\leq$ 50 ppm
Ni: balance to 100%.

4 Claims, 3 Drawing Sheets

NICKEL-BASED MONOCRYSTALLINE SUPERALLOY, IN PARTICULAR FOR THE BLADES OF A TURBOMACHINE

The invention relates to a nickel-based superalloy suitable for monocrystalline solidification, in particular for the moving blades of a turbomachine.

BACKGROUND OF THE INVENTION

Such alloys as defined by particular compositions are described in ONERA's French Pat. No. 2 555 204 (equivalent to U.S. Ser. No. 363,285, filed Mar. 29, 1982). These alloys compare favorably with the best superalloys known previously with respect to high temperature creep resistance, and they also have significantly lower density.

The above French patent mentions, in particular, the highest performance superalloys then in production, known under the reference PWA 1422 (DS 200+Hf), having a density of 8.55 g/cm³ (grams per cubic centimeter). This is an alloy having column-shaped grains obtained by directed solidification and having high strength against forces acting in a direction parallel to the boundaries between the grains.

Said patent also refers to an alloy resulting from recent work on the development of novel compositions suitable for making monocrystalline blades by directed solidification. This alloy known under the reference PWA 1480 (or alloy 454) has a density of 8.7 g/cm³.

The resistance of these prior alloys to creep when hot is obtained in conventional manner by massive additions of refractory elements such Ta, W, Mo, or Re. Thus, alloy 454 contains 12% Ta and 4% W, and alloy DS 200+Hf contains 12% W.

These refractory elements play an important part in reducing creep rate, thereby providing a proportional increase in operating lifetime.

Even at high temperatures, these elements have very low diffusion rates, thereby slowing down the coalescence rate of the hardening or gamma prime phase $Ni_3$(Al, Ti, ...) on which hot creep resistance depends.

However, these refractory elements are very heavy and even if they do increase hot creep resistance, they suffer from the drawback of simultaneously increasing the density of the alloy.

The alloy density could be reduced by adding large quantities of light elements, and in particular of aluminum, however this would give rise to primary precipitation of the gamma prime phase, and the alloy would not have the required creep characteristics.

In order to reconcile the contradictory requirements relating to density and to creep resistance, work done by the Applicant concerning superalloys for turbomachine blades has led to the optimization of two parameters $S_1$ and $S_2$ respectively related to the concentration of refractory elements and to the concentration of elements which participate in the formation of the hardening gamma prime phase, namely:

$S_1 = 0.5 W + Ta + Mo$ where the chemical symbols represent weight percentages of the corresponding elements, and $S_2 = Al + Ti + Ta + Nb + V$ where the chemical symbols represent percentages in terms of numbers of atoms of the elements.

The above-specified patent proposes alloy compositions in which $S_1$ lies in the range 4% to 9% by weight and $S_2$ lies between 14.9% and 20.6% of the atoms.

The quantity of vanadium in the sum $S_2$ serves to enlarge the heat treatment window, i.e. the temperature range between the end of the gamma prime phase being put into solution and the starting melting point of the alloy, and this can be advantageous when heat treatment is performed in an industrial context.

C, B, and Zr are not incorporated in these alloys in order to avoid reducing the starting melting temperature of the alloy and thus to allow the part to be raised during heat treatment to a sufficiently high temperature for the gamma prime phase to be put back into solution together with substantially all of the gamma/gamma prime eutectic, with the combination then being precipitated during cooling in the form of fine gamma prime particles.

Patent No. 2 555 204 proposes the following composition where the percentages are by weight:

| | | |
|---|---|---|
| Co 5 to 7% | Cr 5 to 10% | Mo 0.5 to 2.5% |
| W 0 to 3.5% | Al 6 to 7.5% | Ti 1.5 to 2.25% |
| Nb 0 to 0.5% | Ta 2 to 4% | V 0.3 to 0.6% |
| Ni balance to 100% without voluntary addition of B, C, Zr. | | |

After making the alloy into a monocrystalline blade, the blade is subjected to heat treatment to put the gamma prime phase into solution. This treatment consists in raising the part to a temperature lying in the range 1290° C. to 1325° C., depending on its composition, for a period of time lying between thirty minutes and four hours.

The part is then cooled in air. Heat treatment, as defined in French Pat. No. 2 503 188 filed Apr. 3, 1981 (equivalent to U.S. continuation Ser. No. 878,401 filed June 20, 1986), is then applied to precipitate the gamma prime phase.

This precipitation takes place at a temperature of more than 1000° C.

A regular distribution of gamma prime particles having an average size of 0.5 microns is thus obtained.

The precipitates are aligned along crystallographic directions of the <100> type.

The relative density of such alloys is about 8.2.

It has been observed that alloys in accordance with patent No. 2 555 204 which contain at least 0.3% vanadium do not stand up well to cyclic oxidation.

Although, in practice, turbine blade alloys are nearly always covered with a protective layer against corrosion and oxidation, it is important that the naked material is also capable of standing up well to environmental conditions in order to avoid accelerated degradation of the alloy whenever the coating is damaged.

The invention is based on the surprising observation that some vanadium-free alloys not only have considerably higher creep resistance characteristics than the alloys described in examples 1 and 2 of the above-mentioned patent (alloys 1 and 2 whose compositions are reproduced in table 1 below), but also have much better resistance to cyclic oxidation at 1100° C. than said alloys 1 and 2. Even more surprisingly, the heat treatment window of these vanadium-free alloys is about 20° C., i.e. practically the same as for alloys 1 and 2. It is thought that this result is due mainly to the very low concentration of boron in alloys in accordance with the invention (not more than 10 ppm), which means that there are hardly any drawbacks in doing without vanadium.

The invention relates to alloy compositions in which the parameter $S_1$ as defined above lies between 7.8% and 8.5% by weight and the parameter $S_2$ lies between 15.6% and 16.88% of the atoms.

SUMMARY OF THE INVENTION

More precisely, the composition by weight of alloys in accordance with the invention is as follows:

| | |
|---|---|
| Co: | 5.0 to 6.0% |
| W: | 4.8 to 5.2% |
| Cr: | 7.8 to 8.3% |
| Al: | 5.8 to 6.1% |
| Ta: | 3.3 to 3.7% |
| Mo: | 2.1 to 2.4% |
| Ti: | 1.8 to 2.2% |
| B: | ≦10 ppm |
| Zr: | ≦50 ppm |
| Ni: | balance to 100%. |

Preferably, this composition is substantially as follows:

| | |
|---|---|
| Co | 5.5% |
| W | 5.0% |
| Cr | 8.1% |
| Al | 6.1% |
| Ta | 3.4% |
| Mo | 2.2% |
| Ti | 2.0% |
| B | ≦10 ppm |
| Zr | ≦50 ppm |
| Ni | balance to 100%. |

The invention also provides a method of fabricating a part, in particular a turbomachine blade, made of a superalloy having the above composition, in which the part is subjected to the heat treatments defined above with reference to the alloys of French Pat. No. 2 555 204. The invention also provides a part obtained by the method.

That is a turbomachine blade is manufactured from the abovementioned new superalloy by the following steps:

(a) working said superalloy into a monocrystalline blade;

(b) heating the monocrystalline blade to a sufficiently high temperature for a sufficient length of time to put the gamma prime phase into solution;

(c) cooling the monocrystalline blade in the air; and (d) increasing the temperature of the monocrystalline blade following step (c) to a temperature of more than 1000° C. in order to cause the gamma prime phase to precipitate.

BRIEF DESCRIPTION OF THE DRAWINGS

An embodiment of the invention is described by way of example with reference to the accompanying drawings, in which.

MORE DETAILED DESCRIPTION

Figure 1:
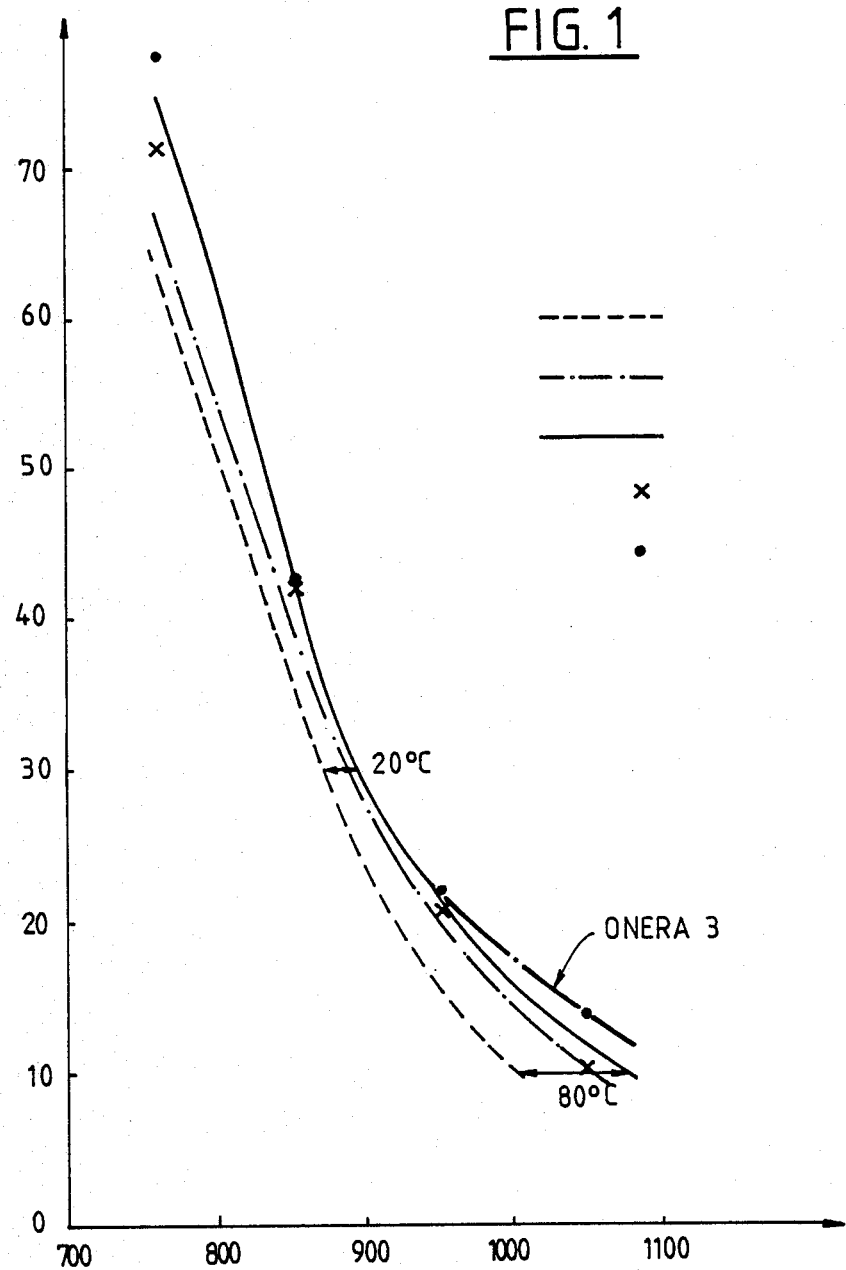
FIGS. 1 and 2 are graphs showing the hot creep characteristics of various alloys.

An alloy called ONERA 3 whose composition by weight is given in table 1 was prepared by melting followed by monocrystalline solidification. Table 1 also gives the composition of the above-mentioned alloy 454 together with the alloys ONERA 1 and ONERA 2 of French Pat. No. 2 555 204.

The relative density of the alloy ONERA 3 is substantially equal to 8.25 g/cm³.

TABLE 1

| | ALLOY | | | |
|---|---|---|---|---|
| Element | PWA 1480 (Alloy 454) | ONERA 1 | ONERA 2 | ONERA 3 |
| Co | 5% | 5% | 5% | 5.55% |
| W | 4% | 4% | 4% | 4.98% |
| Nb | 0 | 0 | 0.5% | 0 |
| Cr | 10% | 7% | 7% | 8.1% |
| Al | 5% | 6% | 6% | 6.07% |
| Ta | 12% | 4% | 3% | 3.36% |
| Mo | 0 | 2.25% | 2.25% | 2.22% |
| Ti | 1.5% | 2% | 2% | 2.02% |
| V | 0 | 0.5% | 0.5% | 0 |
| B | 0 | 0 | 0 | 0 |
| Zr | 0 | 0 | 0 | ≦50 ppm |
| Ni | balance to 100% | | | |

In table 1, the mention 0 means no voluntary addition of the element concerned.

The creep characteristics of alloy 3 were determined after this alloy has been subjected to the above-defined heat treatments and were compared with the creep characteristics of alloys 1 and 2 after they had been subjected to the same heat treatments, and also with the characteristics of alloys 454 and DS 200+Hf.

Table 2 below gives the time in hours required by each of these five alloys to reach 1% deformation or to break under various different conditions of temperature and stress.

It can be seen that all of the values relating to the alloy ONERA 3 are better than the corresponding values for any of the other alloys, with the difference being particularly spectacular for the highest test temperature, namely 1050° C.

TABLE 2

| | | | Creep characteristics | | | | |
|---|---|---|---|---|---|---|---|
| Temp. (°C.) | Stress (MPa) | Creep event | Alloy DS200 + Hf PWA 1422 | Alloy 454 PWA 1480 | Alloy ONERA 1 | Alloy ONERA 2 | Alloy ONERA 3 |
| 760 | 750 | 1% | 10 | 60 | 72 | 37 | 156 |
| | | break | 60 - 15 | 630 | 847 | 550 | 908 |
| 850 | 500 | 1% | 40 | 60 | 111 | 84 | 114 |
| | | break | 100 | 183 | 331 | 280 | 338 |
| 950 | 240 | 1% | 45 | 115 | 100 | 105 | 133 |
| | | break | 170 | 270 | 250 | 250 | 352 |
| 1050 | 120 | 1% | 32 | 182 | 260 | 151 | 696 |
| | | break | 100 | 335 | 400 | 260 | 830 |

The curves of FIG. 1 show how the specific stress (ratio of stress divided by density) for which an elongation of 1% is obtained in one thousand hours varies as a function of temperature.

Figure 2:
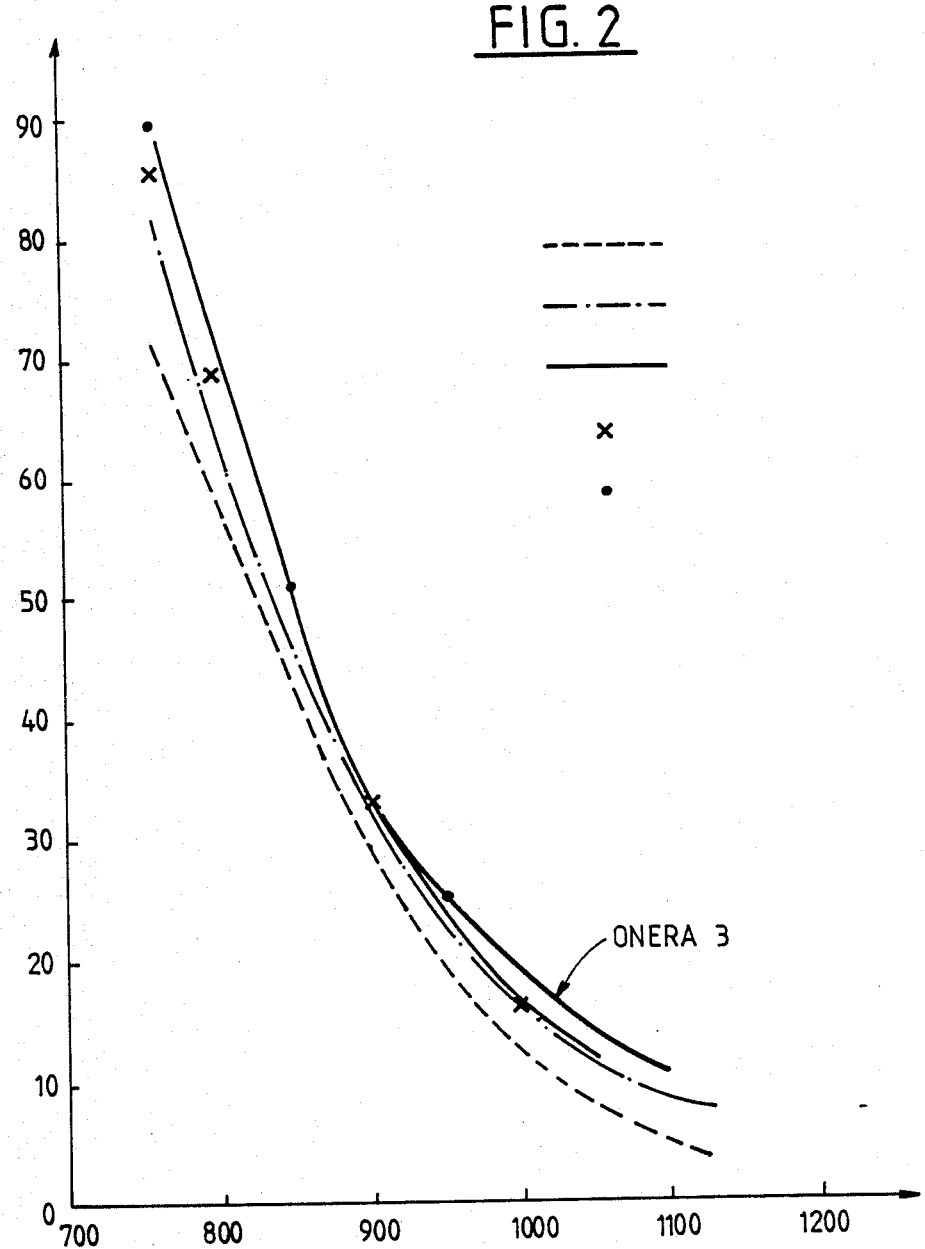

FIG. 2 provides similar curves relating to the specific stress for breaking in one thousand hours.

These curves confirm the superiority of the alloy ONERA 3 over previously known alloys, particularly at high temperatures.

Cyclic oxidation tests at 1100° C. were performed for the alloys ONERA 1 to 3, under the following conditions: maintain for one hour in air at 1100° C. in an oven, cool down to about 200° C. in four minutes, and reheat in the oven in eight minutes.

Figure 3:
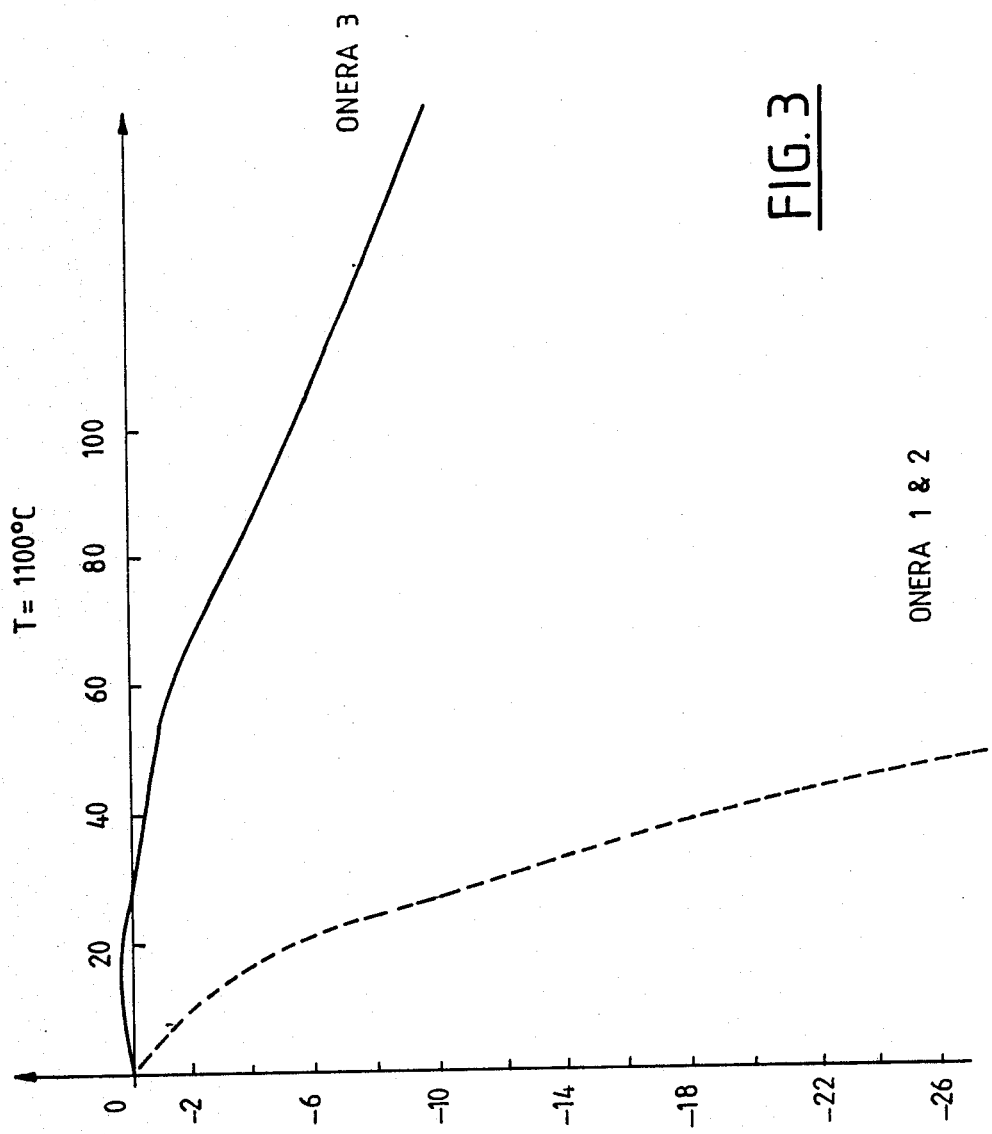
FIG. 3 is a graph showing the resistance of various alloys to cyclic oxidation at 1100° C.

The samples were weighed every ten cycles to determine variations in mass per unit area. The results are given in FIG. 3 which shows the modest performance of the alloys in accordance with French Pat. No. 2 555 204 and the very considerable improvement obtained in this respect by the present invention.

We claim:

1. A method of manufacturing a turbomachine blade from a superalloy consisting essentially of:

Co: 5.0 to 6.0% by weight
W: 4.8 to 5.2%
Cr: 7.8 to 8.3%
Al: 5.8 to 6.1%
Ta: 3.3 to 3.7%
Mo: 2.1 to 2.4%
Ti: 1.8 to 2.2%
B: $\leqq 10$ ppm;
Zr: $\leqq 50$ ppm; and
Ni: balance to 100%;

which comprises the steps of:
 (a) working said superalloy into a monocrystalline blade;
 (b) heating the monocrystalline blade to a sufficiently high temperature for a sufficient length of time to put its gamma prime phase into solution;
 (c) cooling the monocrystalline blade in the air; and
 (d) increasing the temperature of the monocrystalline blade following step (c) to a temperature of more than 1000° C. in order to cause the gamma prime phase to precipitate.

2. The method defined in claim 1 wherein according to step (b) the gamma prime phase is put into solution at a temperature lying in the range of 1290° C. to 1325° C.

3. The method defined in claim 1 wherein according to step (a) the monocrystalline blade is obtained by melting the alloy followed by monocrystalline solidification.

4. The blade obtained by the method defined in claim 1.

* * * * *

Disclaimer

4,837,384.—*Tasadduq Khan,* Jouy en Josas; *Pierre Caron; Jean-Louis Raffestin,* both of Les Ulis, all of France. NICKEL-BASED MONOCRYSTALLING SUPERALLOY, IN PARTICULAR FOR THE BLADES OF A TURBOMACHINE. Patent dated Jun. 6, 1989. Disclaimer filed July 3, 1989, by the assignee, Office National D'Etudes et de Recherches Aerospatiales.

The term of this patent subsequent to February 13, 2007, has been disclaimed.
[ *Official Gazette July 10, 1990* ]